US008592982B2

(12) United States Patent
Lai et al.

(10) Patent No.: US 8,592,982 B2
(45) Date of Patent: Nov. 26, 2013

(54) SEMICONDUCTOR PACKAGE HAVING PROXIMITY COMMUNICATION SIGNAL INPUT TERMINALS AND MANUFACTURING METHODS THEREOF

(75) Inventors: Yi-Shao Lai, Taipei (TW); Tsung-Yueh Tsai, Kaohsiung (TW); Ming-Kun Chen, Kaohsiung (TW); Tai-Ping Wang, New Taipei (TW); Ming-Hsiang Cheng, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 247 days.

(21) Appl. No.: 13/252,850

(22) Filed: Oct. 4, 2011

(65) Prior Publication Data

US 2012/0153489 A1   Jun. 21, 2012

(30) Foreign Application Priority Data

Dec. 18, 2010  (CN) .......................... 2010 1 0613151

(51) Int. Cl.
*H01L 23/52* (2006.01)
*H01L 23/48* (2006.01)
*H01L 29/40* (2006.01)

(52) U.S. Cl.
USPC ................ 257/758; 257/E23.062; 257/686; 257/777; 438/118; 438/622

(58) Field of Classification Search
USPC ........... 257/E23.019, E23.062, E23.173, 531, 257/534, 685, 686, 700, 758, 773, 777, 257/784; 438/118, 184, 241, 622
See application file for complete search history.

(56) References Cited

U.S. PATENT DOCUMENTS

| 5,818,112 | A | 10/1998 | Weber et al. |
|---|---|---|---|
| 6,310,400 | B1 | 10/2001 | Doyle et al. |
| 6,500,696 | B2 | 12/2002 | Sutherland |
| 6,559,531 | B1 * | 5/2003 | Sutherland .................... 257/686 |
| 6,656,786 | B2 * | 12/2003 | Chiang et al. ................. 438/241 |
| 7,015,575 | B2 * | 3/2006 | Suenaga et al. ............... 257/700 |
| 7,067,910 | B2 | 6/2006 | Drost et al. |
| 7,183,658 | B2 * | 2/2007 | Towle et al. .................. 257/784 |
| 7,266,262 | B2 * | 9/2007 | Ogawa ............................ 385/14 |
| 7,582,925 | B2 * | 9/2009 | Jung et al. ..................... 257/296 |
| 7,606,400 | B2 * | 10/2009 | Ryhanen et al. .............. 382/124 |
| 8,144,825 | B1 * | 3/2012 | Duong ........................... 375/354 |
| 8,273,616 | B2 * | 9/2012 | Chen et al. .................... 438/184 |
| 8,378,448 | B2 * | 2/2013 | Ding et al. .................... 257/531 |
| 8,378,700 | B2 * | 2/2013 | Watanabe et al. ........ 324/754.07 |
| 8,405,453 | B2 * | 3/2013 | Woods et al. ................. 327/553 |
| 2011/0241215 | A1 * | 10/2011 | Sankman et al. ............. 257/773 |
| 2013/0020468 | A1 * | 1/2013 | Mitsuhashi et al. ........ 250/208.1 |
| 2013/0037965 | A1 * | 2/2013 | Morimoto et al. ............ 257/774 |

* cited by examiner

Primary Examiner — Chris Chu
(74) Attorney, Agent, or Firm — Foley & Lardner LLP

(57) ABSTRACT

A semiconductor package includes a semiconductor structure. The semiconductor structure includes a plurality of dielectric layers and a plurality of conductive interconnects embedded in the semiconductor structure. The semiconductor structure also includes a plurality of proximity communication signal input terminals. At least one of the plurality of proximity communication signal input terminals includes a first electrode and a second electrode. The first electrode and the second electrode are spaced apart so as to be configured to provide proximity communication through capacitive coupling. The first electrode is exposed proximate to a surface of the semiconductor structure.

20 Claims, 3 Drawing Sheets

SEMICONDUCTOR PACKAGE HAVING PROXIMITY COMMUNICATION SIGNAL INPUT TERMINALS AND MANUFACTURING METHODS THEREOF

CROSS-REFERENCE TO RELATED APPLICATION

This application claims the benefit of China Patent Application No. 201010613151.6, filed on Dec. 18, 2010, the subject matter of which is incorporated herein by reference.

BACKGROUND OF THE INVENTION

1. Field of the Invention

The present invention relates generally to semiconductor packages and manufacturing methods thereof. More particularly, the invention relates to a semiconductor package having proximity communication signal input terminals and manufacturing methods thereof.

2. Description of Related Art

A technique referred to as "proximity communication" can overcome limitations of conductive electrical interconnections by using capacitive coupling to provide communications between two semiconductor devices. This technique can provide a higher density of input/output pads, such as a density about 100 times greater, than a typical density of input/output pads for traditional wire-bonding and flip-chip bonding. In addition, a distance between edges of these input/output pads can be smaller than 10 microns (μm). To achieve proximity communication, input/output pads included in each of multiple semiconductor devices or packages should be placed face-to-face with high accuracy. For example, achieving sufficiently accurate alignment (such as within about 10 μm) between the semiconductor devices or packages can be difficult. If such accurate alignment between the input/output pads of the semiconductor devices or packages is not achieved, this can result in displacement between the input/output pads and variable proximity communication capacitance. If the capacitance cannot be fixed, the quality of the signal can be diminished during transmission, or the signal may fail to be transmitted. Such alignment errors should therefore be eliminated or minimized during a semiconductor device packaging process.

It is against this background that a need arose to develop the semiconductor package and related methods described herein.

SUMMARY OF THE INVENTION

One aspect of the invention relates to a semiconductor package. In one embodiment, the semiconductor package includes a semiconductor structure. The semiconductor structure includes a plurality of dielectric layers and a plurality of conductive interconnects embedded in the semiconductor structure. The semiconductor structure also includes a plurality of proximity communication signal input terminals. At least one of the plurality of proximity communication signal input terminals includes a first electrode and a second electrode. The first electrode and the second electrode are spaced apart so as to be configured to provide proximity communication through capacitive coupling. The first electrode and the second electrode are exposed proximate to a surface of the semiconductor structure.

In another embodiment, the semiconductor package includes a first semiconductor device including a plurality of proximity communication signal input terminals, and a second semiconductor device electrically connected to the first semiconductor device through at least one of the plurality of proximity communication signal input terminals. Each proximity communication signal input terminal includes a first electrode and a second electrode configured to provide proximity communication through capacitive coupling. The first electrode is exposed proximate to a surface of the first semiconductor device, and the second electrode is embedded within the first semiconductor device.

In another embodiment, the semiconductor package includes a first semiconductor structure and a second semiconductor structure. The second semiconductor structure includes embedded means for providing proximity communication through capacitive coupling, the proximity communication being between the first semiconductor structure and the second semiconductor structure.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
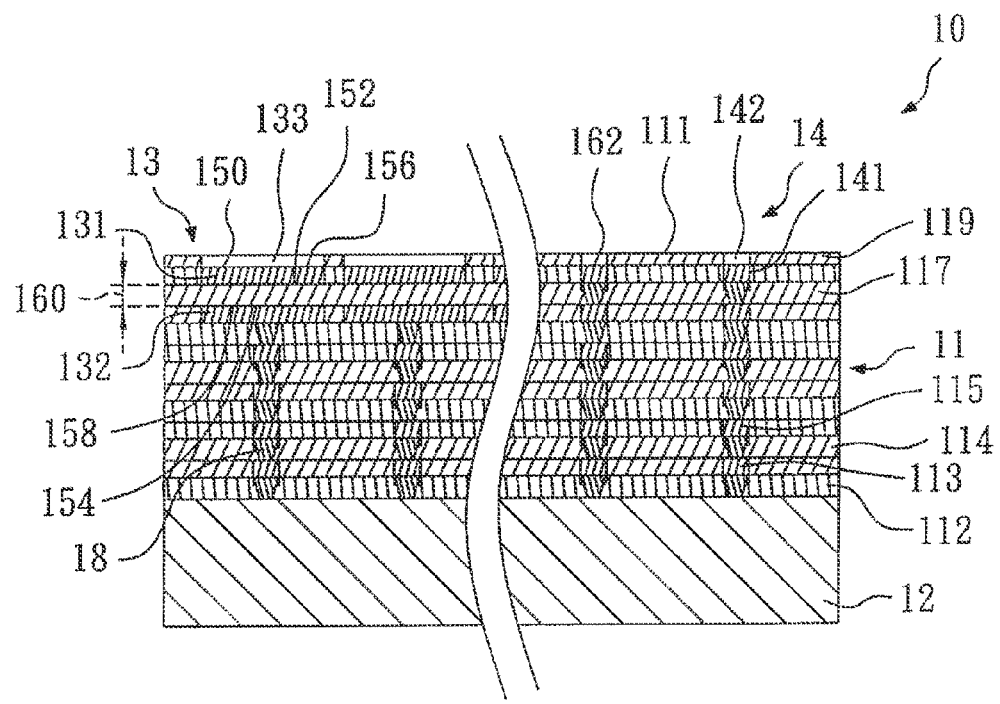
FIG. 1 illustrates a cross section of a semiconductor structure including proximity communication signal input terminals, according to an embodiment of the invention.

Referring to FIG. 1, a cross section of a semiconductor structure 10 including proximity communication signal input terminals is illustrated, according to an embodiment of the invention. The semiconductor structure 10 includes an interconnect structure 11, a semiconductor material 12, and a plurality of proximity communication signal input terminals 13. The semiconductor material 12 may be a semiconductor substrate, e.g. a bulk silicon substrate, or it may include other semiconductor materials, e.g. group III, group IV, and/or group V elements. Semiconductor devices, e.g. transistors (not shown), may be formed on the upper surface of the semiconductor material 12. The interconnect structure 11 is disposed on the semiconductor material 12, and is electrically connected to the semiconductor devices. In one embodiment, the proximity communication signal input terminals 13 are embedded in, or built into, the interconnect structure 11 of the semiconductor structure 10. The proximity communication signal input terminals 13 may be disposed proximate to a first surface 111 of the semiconductor structure 10. In one embodiment, the proximity communication signal input terminals 13 may be substantially coplanar with the first surface 111.

The interconnect structure 11 may include a plurality of inter-metal dielectric layers (IMD) (e.g. dielectric layers 112, 114, 117), a plurality of metal lines (e.g. metal lines 113, 115)

and a plurality of vias (e.g. vias 18). The interconnect structure 11 may further include a passivation layer 119 disposed adjacent to the first surface 111.

In one embodiment, each proximity communication signal input terminal 13 includes a first electrode 131 and a second electrode 132. The first electrode 131 may be exposed proximate to the first surface 111, and is configured to electrically connect to external components. The second electrode 132 may be embedded within the interconnect structure 11. In one embodiment, the first electrode 131 may be exposed at the first surface 111. For example, a surface 150 of the first electrode 131 may be substantially coplanar with the first surface 111.

The first electrode 131 and the second electrode 132 may be spaced apart so as to provide proximity communication resulting from capacitive coupling. The first electrode 131 and the second electrode 132 may form a capacitor. For example, a surface 152 of the first electrode 131 may be substantially parallel to a surface 154 of the second electrode 132. In one embodiment, a dielectric layer 117 is disposed between the second electrode 132 and the first electrode 131, so that a distance 160 between the second electrode 132 and the first electrode 131 corresponds to a thickness of the dielectric layer 117.

In one embodiment, an area of the first electrode 131 is larger than an area of the second electrode 132. The larger area of the first electrode 131 can facilitate connection of another semiconductor package or structure to the first electrode 131. The larger area of the first electrode 131 can also enhance predictability and accuracy of capacitance of the proximity communication signal input terminals 113. The area of the first electrode 131 may be in the range from about 1.1 times to about 2 times larger than the area of the second electrode 132, such as 1.1 times, 1.5 times, or 2 times larger. The length of a side 156 of the first electrode 131 may be unequal to that of a corresponding side 158 of the second electrode 132.

The semiconductor structure 10 may include a plurality of input windows 133, disposed at the first surface 111 and exposing the first electrodes 131. An area of the input windows 133 may be substantially equal to that of corresponding ones of the first electrodes 131.

The semiconductor structure 10 may include a plurality of signal output terminals 14. Each signal output terminal 14 may include a signal pad 141, an area of the signal pad 141 may be smaller than that of the corresponding first electrode 131, and the signal pad 141 may be exposed proximate to the first surface 111. In one embodiment, the signal pad 141 may be in the range from about 10 µm to about 50 µm on a side, such as 36 µm on a side. The signal pad 141 may be configured to be electrically connected to external components, such as another semiconductor device or package. In one embodiment, the surface 150 of the first electrode 131 may be substantially coplanar with a surface 162 of the signal pad 141. The semiconductor structure 10 may further include a plurality of output windows 142, disposed at the first surface 111 and exposing the signal pads 141. In one embodiment, the second electrode 132 and the signal pad 141 are electrically connected to the semiconductor material 12 by the vias 18.

Embodiments of the invention provide proximity communication through proximity communication signal input terminals. The proximity communication signal input terminals may be embedded in or built into a semiconductor structure, and can thereby overcome the problem of achieving accurate alignment between the input/output pads of semiconductor devices or packages. It is contemplated that forming the proximity communication signal input terminals through typical integrated circuit (IC) wafer processing will increase alignment accuracy of the proximity communication signal input terminals over that achievable through typical IC assembly and packaging processes. Furthermore, in one embodiment, electrodes included in the proximity communication signal input terminals are precisely aligned, thereby accurately fixing capacitance of the proximity communication signal input terminals at a predictable value, and protecting quality of signals transmitted through the proximity communication input terminals.

Figure 2:
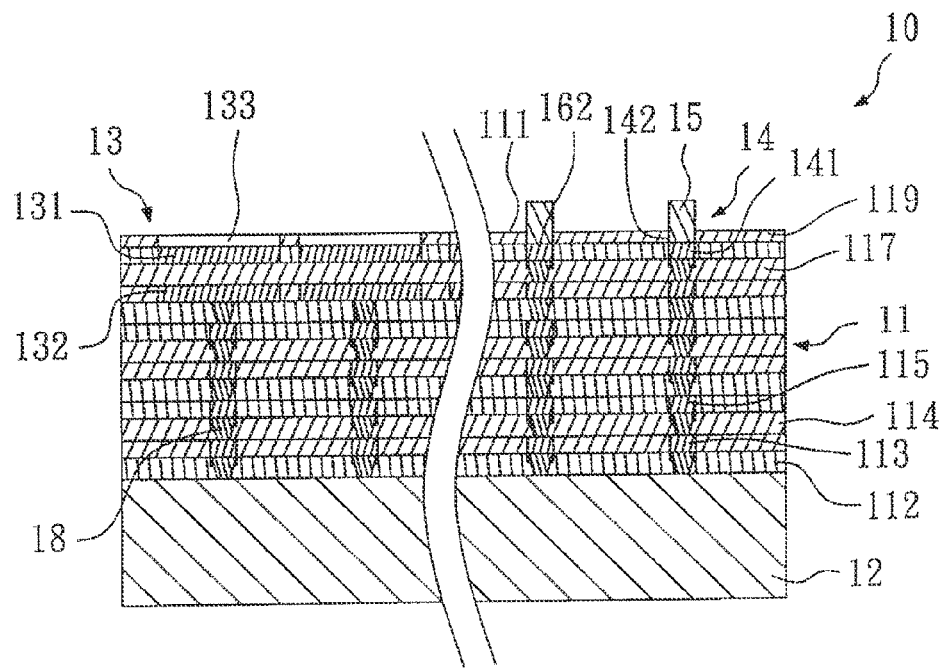
FIG. 2 illustrates a cross section of a semiconductor structure including proximity communication signal input terminals, according to an embodiment of the invention.

FIG. 2 illustrates a cross section of the semiconductor structure 10 including proximity communication signal input terminals, according to an embodiment of the invention The semiconductor structure 10 is as described with reference to FIG. 1, and further includes a plurality of first bumps 15. The first bumps 15 are disposed adjacent to the surfaces 162 of the signal pads 141. In one embodiment, the first bumps 15 are located in the output windows 142, are electrically connected to the signal pads 141, and protrude beyond the first surface 111, so as to be electrically connected to external components, such as a semiconductor device or package.

The semiconductor structure 10 may be electrically connected to external components by the proximity communication signal input terminal 13 and the signal output terminal 14. As described with reference to FIG. 1, the first electrode 131 and the second electrode 132 form a capacitor, so as to provide proximity communication resulting from capacitive coupling. Furthermore, the proximity communication signal input terminal 13 is embedded in, or built into, the semiconductor structure 10, and can thereby overcome the problem of achieving accurate alignment between the input/output pads of semiconductor devices or packages and can reduce or eliminate displacement resulting from misalignment between the first electrode 131 and the second electrode 132. In this way, the proximity communication capacitance of the semiconductor structure 10 can be accurately fixed at a predictable value.

In one embodiment, the proximity communication signal input terminal 13 may be electrically connected to a front-end amplify circuit (not shown), so as to amplify received input signals. In one embodiment, the capacitor formed by the second electrode 132 and the first electrode 131 already provides electrostatic discharge (ESD) protection, so there may be no need to connect an additional ESD protection circuit to the proximity communication signal input terminals 13. The output terminal 14 may connect to an ESD protection circuit.

Figure 3:
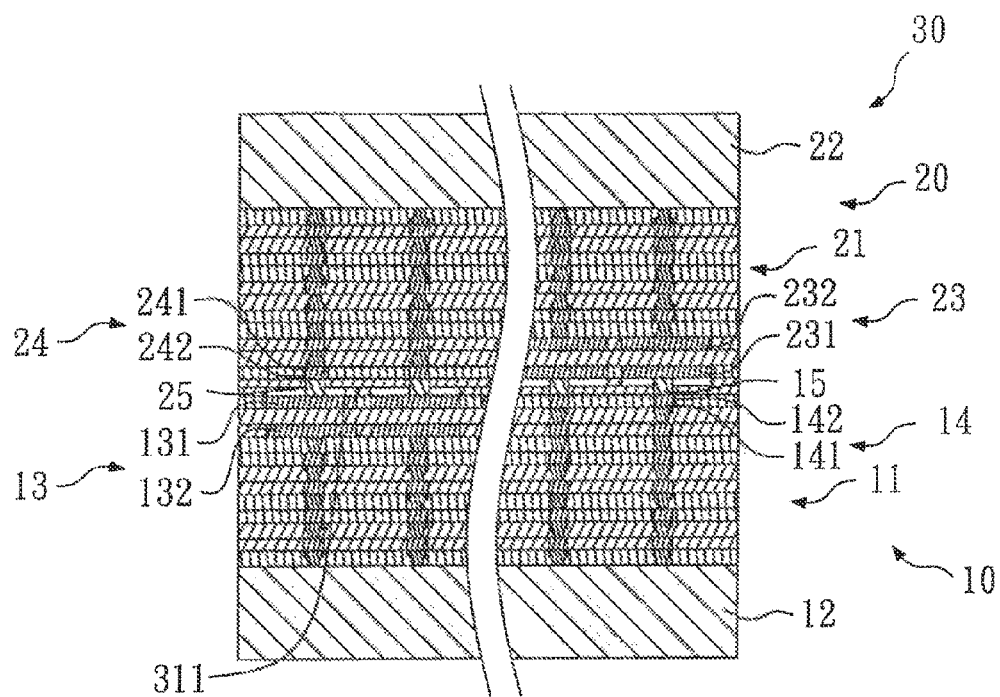
FIG. 3 illustrates a cross section of a semiconductor package including proximity communication signal input terminals, according to an embodiment of the invention.

FIG. 3 illustrates a cross section of a semiconductor package 30 including proximity communication signal input terminals, according to an embodiment of the invention. The semiconductor package 30 includes a first semiconductor device (or chip) 10 and a second semiconductor device (or chip) 20. In one embodiment, the first semiconductor device 10 is substantially similar to the above-mentioned semiconductor structure 10 described with reference to FIGS. 1 and 2, and the same elements are designated by the same reference numbers.

The structure of the second semiconductor device 20 is also substantially similar to that of the first semiconductor device 10. The second semiconductor device 20 includes an interconnect structure 21, a semiconductor material 22, a plurality of proximity communication signal input terminals 23, and a plurality of signal output terminals 24. The proximity communication signal input terminals 23 are embedded in, or built into, the interconnect structure 21 of the second semiconductor device 20, and are disposed proximate to a second surface 311 of the second semiconductor device 20. The proximity communication signal input terminals 23 have similar characteristics to those previously described for the proximity communication signal input terminals 13 with reference to FIGS. 1 and 2.

In one embodiment, each proximity communication signal input terminal 23 of the second semiconductor device 20 includes a first electrode 231 and a second electrode 232. The first electrode 231 and the second electrode 232 have similar characteristics to those previously described for the first electrode 131 and the second electrode 132 with reference to FIGS. 1 and 2, and are therefore not further described here.

Each signal output terminal 24 of the second semiconductor device 20 includes a signal pad 241. The signal output terminal 24 and the signal pad 241 have similar characteristics to those previously described for the signal output terminal 14 and the signal pad 141 with reference to FIGS. 1 and 2, and are therefore not further described here. In one embodiment, the second semiconductor device 20 further includes a plurality of output windows 242, disposed at the second surface 311 and exposing the signal pads 241.

In one embodiment, the first semiconductor device 10 further includes a plurality of first bumps 15, the second semiconductor device 20 further includes a plurality of second bumps 25, the first electrodes 231 of the second semiconductor device 20 and the signal output terminals 14 of the first semiconductor device 10 are electrically connected by the first bumps 15, and the second bumps 25 electrically connect the first electrodes 131 of the first semiconductor device 10 and the signal output terminals 24 of the second semiconductor device 20. In this way, the signal input terminals 13 and the signal output terminals 14 of the first semiconductor device 10 may be electrically connected to the signal output terminals 24 and the signal input terminals 23 of the second semiconductor device 20, respectively.

In one embodiment, the signal output terminals 14 and 24 may have smaller areas that the proximity communication signal input terminals 13 and 23, respectively. This can facilitate the electrical connection of the first semiconductor device 10 and the second semiconductor device 20 via the bumps 15 extending between the terminals 13 and 14, and the bumps 25 extending between the terminals 23 and 24.

The proximity communication signal input terminals 13 of the first semiconductor device 10 and the proximity communication signal input terminals 23 of the second semiconductor device 20 can provide proximity communication resulting from capacitive coupling. Furthermore, the proximity communication signal input terminals 13 and 23 are embedded in, or built into, the first semiconductor device 10 and the second semiconductor device 20, respectively. Since this can reduce or eliminate displacement between the electrodes of the proximity communication signal input terminals 13 and 23 resulting from misalignment, the proximity communication capacitance of the semiconductor package 30 according to the present invention can be accurately fixed at a predictable value.

Figure 4:
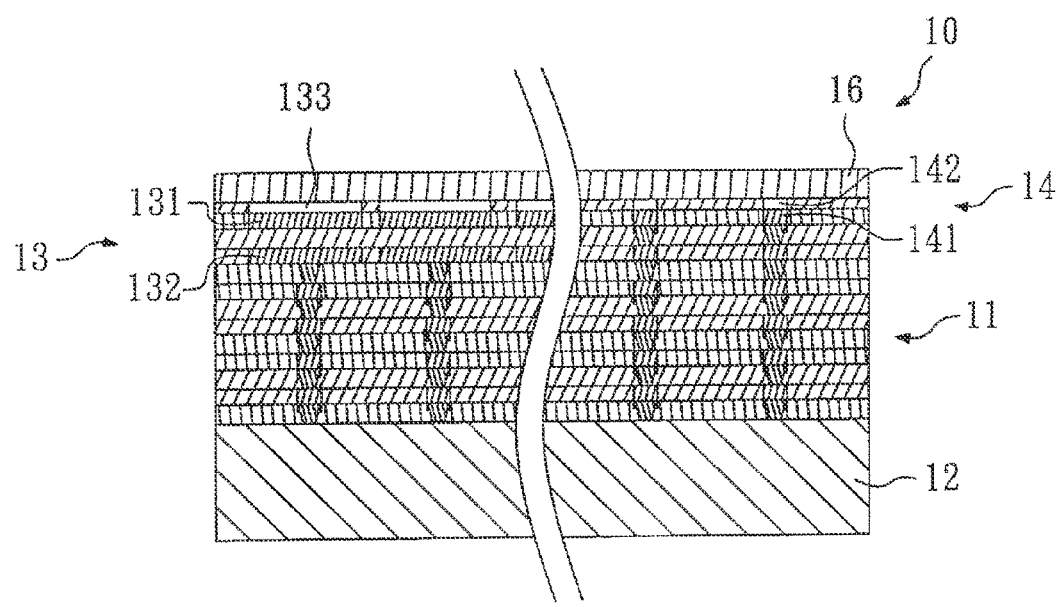
FIG. 4 illustrates a cross section of a semiconductor structure including proximity communication signal input terminals, according to an embodiment of the invention.

FIG. 4 illustrates a cross section of the semiconductor structure 10 including proximity communication signal input terminals, according to an embodiment of the invention. The semiconductor structure 10 is as described with reference to FIGS. 1 and 2, and further includes an anisotropic conductive adhesive layer 16 disposed adjacent to the first surface 111, so that the semiconductor structure 10 can be electrically connected to external components such as another semiconductor device or package.

Figure 5:
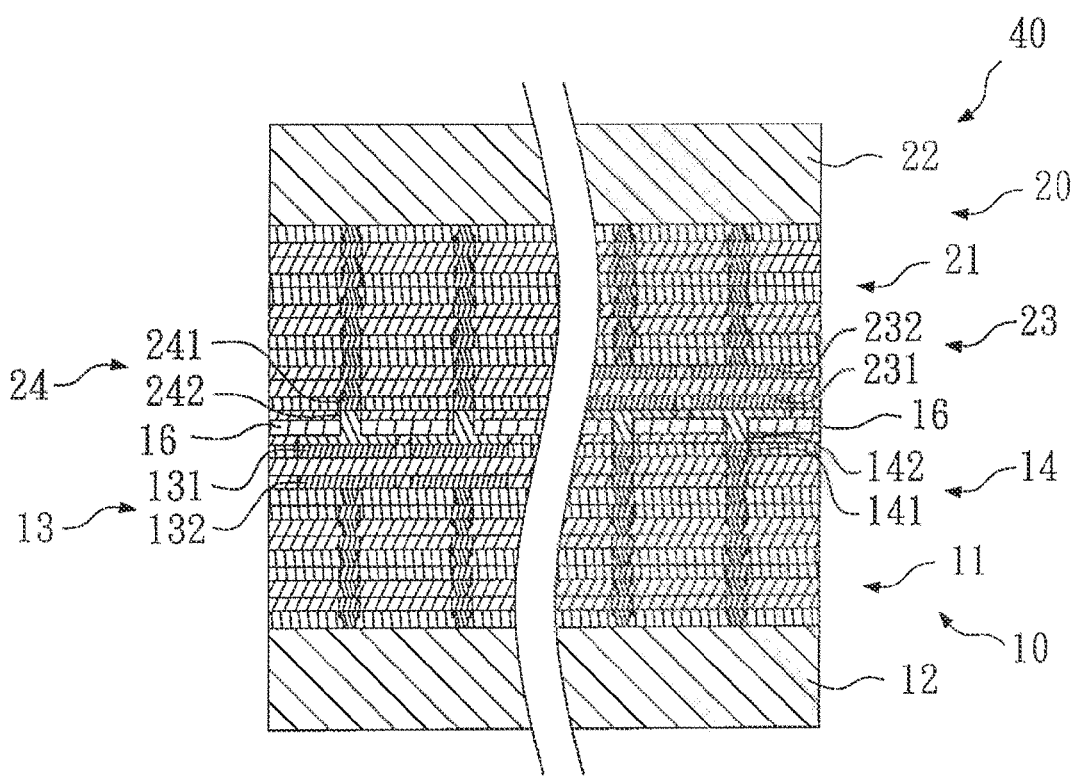
FIG. 5 illustrates a cross section of a semiconductor package including proximity communication signal input terminals, according to an embodiment of the invention.

FIG. 5 illustrates a cross section of a semiconductor package 40 including proximity communication signal input terminals, according to an embodiment of the invention. The semiconductor package 40 includes the first semiconductor device 10 and the second semiconductor device 20 described with reference to FIGS. 1-3, and the same elements are designated by the same reference numbers. The semiconductor package 40 has similar characteristics to those previously described for the semiconductor package 30 with reference to FIG. 3, and therefore differences are described further here.

A difference between the semiconductor package 40 and the semiconductor package 30 described with reference to FIG. 3 is that, in the semiconductor package 40, the first semiconductor device 10 and the second semiconductor device 20 are electrically connected by the anisotropic conductive adhesive layer 16. In one embodiment, the anisotropic conductive adhesive layer 16 electrically connects the first electrodes 131 of the first semiconductor device 10 and the signal output terminals 24 of the second semiconductor device 20, and electrically connects the first electrodes 231 of the second semiconductor device 20 and the signal output terminals 14 of the first semiconductor device 10. In one embodiment, the first semiconductor device 10 and the second semiconductor device 20 are electrically connected by conductive particles in the anisotropic conductive adhesive layer 16.

In one embodiment, when the proximity communication signal input terminals and the signal output terminals of the first semiconductor device 10 and the second semiconductor device 20 are not directly electrically connected by the bumps or the anisotropic conductive adhesive layer, or when the first semiconductor device 10 and the second semiconductor device 20 are not connected face to face, an interposer (not shown) may be used to electrically connect the proximity communication signal input terminal of the first semiconductor device 10 and the signal output terminal of the second semiconductor device 20, and to connect the signal output terminal of the first semiconductor device 10 and the proximity communication signal input terminal of the second semiconductor device 20, so as to electrically connect the first semiconductor device 10 and the second semiconductor device 20. It is contemplated that the interposer can be a typical organic substrate or silicon interposer that allows multiple semiconductor devices or packages to be mounted thereon in a side-by-side configuration, and that is configured to provide electrical connectivity between the semiconductor devices or packages.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention.

Accordingly, unless specifically indicated herein, the order and grouping of the operations are not limitations of the invention.

What is claimed is:

1. A semiconductor package, comprising:
   a semiconductor structure including:
      a plurality of dielectric layers and a plurality of conductive interconnects embedded in the semiconductor structure; and
      a plurality of proximity communication signal input terminals, at least one of the plurality of proximity communication signal input terminals including a first electrode and a second electrode, the first electrode and the second electrode being spaced apart so as to be configured to provide proximity communication through capacitive coupling, wherein the first electrode is exposed proximate to a surface of the semiconductor structure.

2. The semiconductor package of claim 1, wherein the first electrode is exposed at a surface of the semiconductor structure.

3. The semiconductor package of claim 1, further comprising a plurality of signal output terminals configured to electrically connect to another semiconductor structure, wherein each signal output terminal includes a signal pad, an area of the signal pad is smaller than an area of the first electrode, and the signal pad is exposed proximate to the surface.

4. The semiconductor package of claim 1, further comprising a signal output terminal configured to electrically connect to another semiconductor structure and including a signal pad, wherein a surface of the first electrode is substantially coplanar with a surface of the signal pad.

5. The semiconductor package of claim 1, wherein the semiconductor structure is electrically connected to another semiconductor structure through at least one of the plurality of proximity communication signal input terminals.

6. The semiconductor package of claim 1, wherein an area of the first electrode is larger than an area of the second electrode.

7. The semiconductor package of claim 1, wherein:
   a surface of the first electrode is exposed proximate to a surface of the semiconductor structure; and
   the surface of the first electrode is substantially parallel to a surface of the second electrode.

8. A semiconductor package, comprising:
   a first semiconductor device including a plurality of proximity communication signal input terminals, wherein each proximity communication signal input terminal includes a first electrode and a second electrode configured to provide proximity communication through capacitive coupling, the first electrode being exposed proximate to a surface of the first semiconductor device, the second electrode being embedded within the first semiconductor device; and
   a second semiconductor device electrically connected to the first semiconductor device through at least one of the plurality of proximity communication signal input terminals.

9. The semiconductor package of claim 8, further comprising an anisotropic conductive adhesive layer configured to electrically connect at least one of the first electrodes of the first semiconductor device to corresponding signal output terminals of the second semiconductor device.

10. The semiconductor package of claim 8, further comprising an interposer configured to electrically connect the first electrodes of the first semiconductor device to corresponding signal output terminals of the second semiconductor device.

11. The semiconductor package of claim 8, wherein an area of at least one of the first electrodes is larger than an area of the corresponding second electrode.

12. The semiconductor package of claim 8, wherein:
   a surface of each of the first electrodes is exposed proximate to the surface of the first semiconductor device; and
   the surface of at least one of the first electrodes is substantially parallel to a surface of the corresponding second electrode.

13. The semiconductor package of claim 8, wherein the first semiconductor device further includes a plurality of signal output terminals electrically connected to the second semiconductor device, wherein each signal output terminal includes a first surface exposed proximate to the surface of the first semiconductor device, and an area of each of the first surfaces is smaller than an area of each of the first electrodes.

14. The semiconductor package of claim 8, wherein:
   the plurality of proximity communication signal input terminals is a first plurality of proximity communication signal input terminals; and
   the second semiconductor device includes a second plurality of proximity communication signal input terminals, the second semiconductor device being electrically connected to the first semiconductor device through at least one of the second plurality of proximity communication signal input terminals.

15. A semiconductor package, comprising:
   a first semiconductor structure; and
   a second semiconductor structure including embedded means for providing proximity communication through capacitive coupling, the proximity communication being between the first semiconductor structure and the second semiconductor structure.

16. The semiconductor package of claim 15, further comprising conductive means for electrically connecting the embedded means to the first semiconductor structure.

17. The semiconductor package of claim 15, wherein the second semiconductor structure further includes a plurality of signal output terminals electrically connected to the first semiconductor structure, wherein each signal output terminal includes a first surface exposed proximate to a surface of the second semiconductor structure, and an area of at least one of the first surfaces is smaller than an area of at least one exposed surface of the embedded means.

18. The semiconductor package of claim 15, wherein the embedded means includes:
   a first electrode having a first surface exposed proximate to a surface of the second semiconductor structure; and
   a second electrode having a second surface substantially parallel to the first surface.

19. The semiconductor package of claim 18, wherein an area of the first electrode is larger than an area of the second electrode.

20. The semiconductor package of claim 15, wherein:
   the embedded means is a first embedded means; and
   the first semiconductor structure includes second embedded means for providing proximity communication through capacitive coupling, the proximity communication being between the first semiconductor structure and the second semiconductor structure.

* * * * *